United States Patent [19]
Saubolle

[11] Patent Number: 5,376,887
[45] Date of Patent: Dec. 27, 1994

[54] BATTERY TESTER WITH APERTURES FOR PLURAL TYPES AND SIZES OF CELLS

[76] Inventor: Malcolm C. Saubolle, 45 Metzak Dr., Brampton, Ontario, Canada, L6Z 4N4

[21] Appl. No.: 952,813

[22] Filed: Sep. 28, 1992

[51] Int. Cl.$^5$ ............................................ G01N 27/416
[52] U.S. Cl. .................................. 324/433; 324/435; 324/437; 340/636
[58] Field of Search .................. 320/48; 324/426, 433, 324/435, 437; 340/636

[56] References Cited

U.S. PATENT DOCUMENTS

| | | | |
|---|---|---|---|
| D. 330,519 | 10/1992 | Wang | D10/77 |
| 3,930,198 | 11/1975 | Williamson | 320/48 |
| 3,961,256 | 6/1976 | Gaskell et al. | 324/96 |
| 3,974,441 | 8/1976 | Van Den Haak | 324/433 |
| 4,020,243 | 4/1977 | Oldford | 324/426 |
| 4,360,780 | 11/1982 | Skutch | 324/437 |
| 4,439,736 | 3/1984 | Schwartz | 324/437 |
| 4,514,695 | 4/1985 | Lau | 324/437 |
| 4,607,227 | 8/1986 | Heitert et al. | 324/437 |
| 4,659,994 | 4/1987 | Poljak | 324/426 |
| 5,126,675 | 6/1992 | Yang | 324/435 |
| 5,130,658 | 7/1992 | Bohmer | 324/435 |

Primary Examiner—Kenneth A. Wieder
Assistant Examiner—Christopher M. Tobin
Attorney, Agent, or Firm—Ridout & Maybee

[57] ABSTRACT

A low profile battery tester uses tapered apertures to located batteries in a thin tablet shaped body for testing. In one embodiment for conventional dry cells, the taper is in openings through the body, and in another embodiment for button cells the aperture does not extend through the body and the taper is in the plane of the body. A display of battery condition is provided by an array of light emitting diodes mostly driven by comparators, voltage references for the comparators being provided by a circuit including one of the light emitting diodes.

3 Claims, 3 Drawing Sheets

BATTERY TESTER WITH APERTURES FOR PLURAL TYPES AND SIZES OF CELLS

This invention relates to testers for commonly used dry cells and batteries. The term battery may be used collectively in the present context to include reference to single as well as multiple cells.

The widespread use of such batteries in consumer appliances has given rise to a demand for devices for testing them. These range from simplistic cell testing devices to relatively bulky devices designed to accept and test popular sizes of battery and display an indication of battery condition. The small button cells which are increasingly used, and come in a range of physical sizes also present a testing problem, not least because lithium cells have a substantially higher voltage, typically 3 volts, than silver oxide or alkaline-manganese cells whose voltage is typically about 1.5 volts. There is a need for compact, economical testers capable of testing a range of batteries and providing positive indication of battery condition to a user.

The present invention seeks to provide such testers. According to the invention, a battery tester comprises a tablet shaped body having a thickness which is very small compared with its length and width, at least one recess in the body shaped to receive batteries to be tested and having a taper within the thickness of the body configured to guide terminals of said batteries into contact with test contacts within the thickness of the body, and a battery testing circuit within the thickness of the body and connected to said test contacts, the battery testing circuit including comparators carrying out comparisons of a voltage appearing across said contacts with plural reference voltages, and an array of light emitting diodes driven by said comparators to display results of said comparisons.

The tester can be constructed in separate embodiments for testing conventional batteries and battery cells on the one hand and button type cells on the other hand. For conventional battery cells, the body defines multiple recesses which are apertures through the body, the taper is a taper of the width of each aperture from a width slightly greater than the diameter of a size of cylindrical battery to be tested to a width slightly smaller than said diameter, and the test contacts are disposed at opposite ends of the recesses whereby a battery to be tested when inserted in an aperture appropriate to its size will be guided into a position engaging the contacts.

For button cells, the body defines a recess which extends only from one face of the body, and has a taper in the plane of the body defined by converging side walls of the recess, one test contact being located in at least one side wall of the recess, and the other forming a bottom wall of the recess, whereby a button cell to be tested may be placed with one terminal resting on the bottom wall of the recess and moved into the taper until another terminal formed by a peripheral side wall of the cell contacts said one test contact.

The test circuit itself comprises a reference voltage generator, a divider chain of resistors across which the reference voltage generator generates a reference voltage, multiple comparators each connected to a different node of the divider chain and to an intermediate point of a resistor chain connected between the test contacts, and light emitting diodes driven by outputs of the comparators. In a preferred arrangement, the reference voltage generator includes a first forward biased light emitting diode in series with a load resistor, which provides a first indication from the device, and a further forward biased diode in series with a resistor and in parallel with the first light emitting diode, the voltage across the further diode providing the reference voltage.

Figure 1:
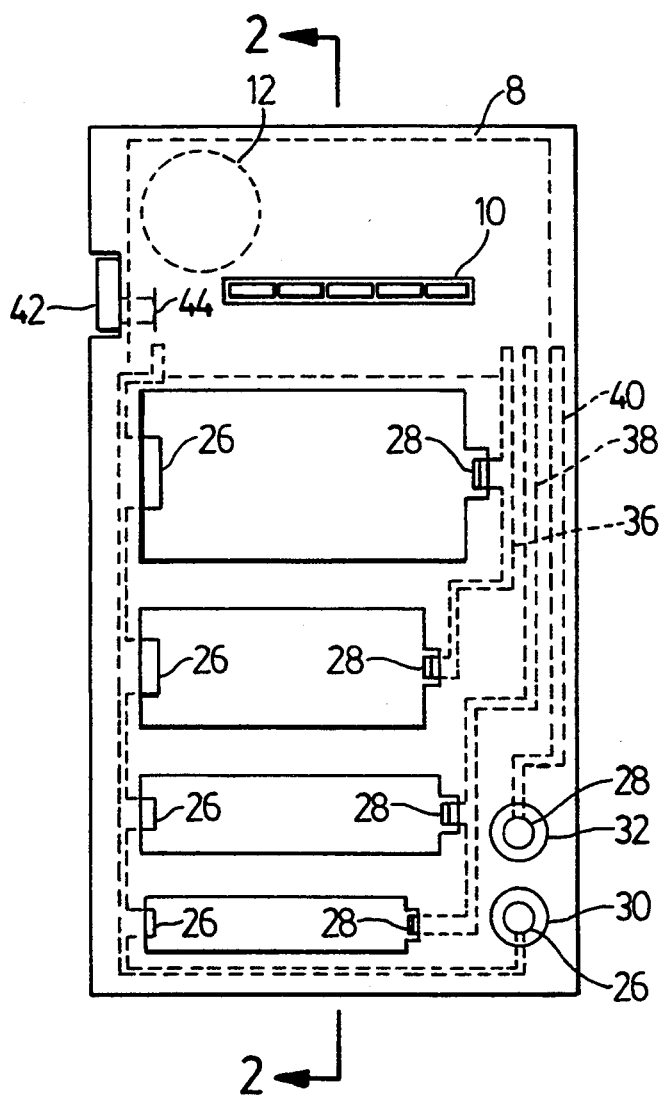
FIG. 1 is a plan view of a first embodiment of battery tester according to the invention.
Figure 2:
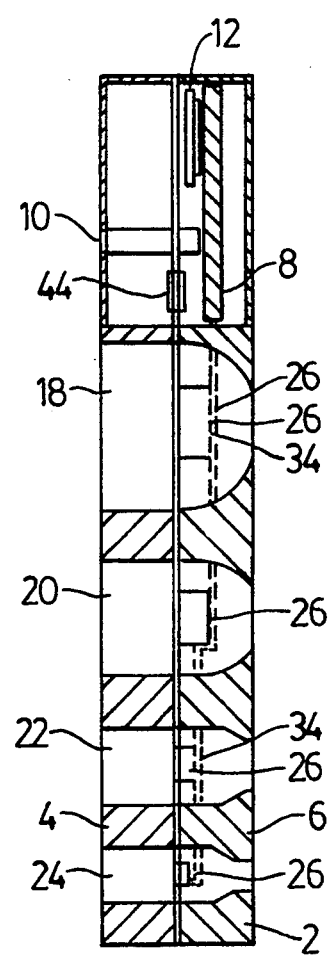
FIG. 2 is a section on line 2—2 in FIG. 1.
Figure 3:
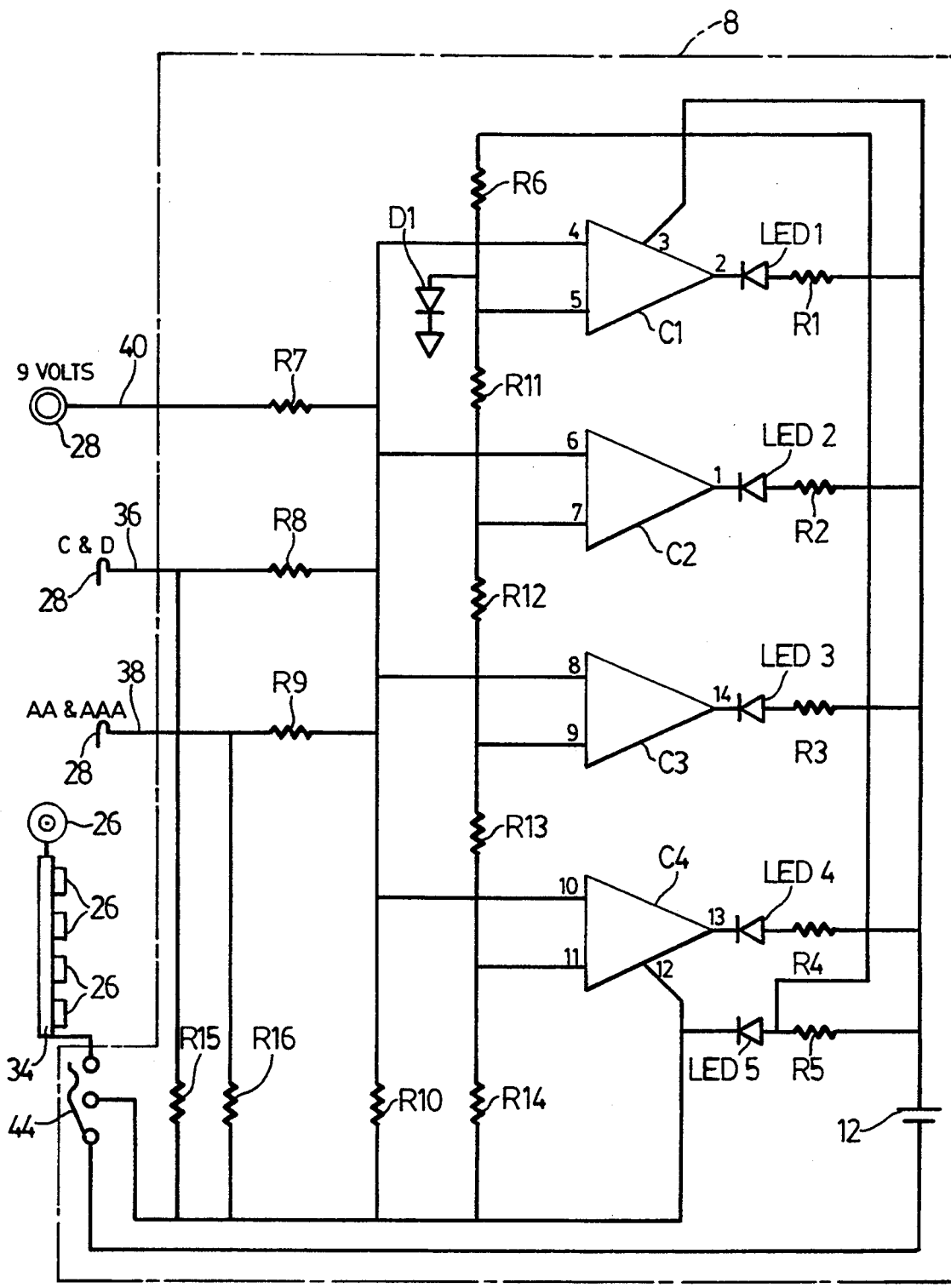
FIG. 3 is a schematic diagram of a tester circuit used in the embodiment of FIG. 1.

Referring to FIGS. 1 and 2, the battery tester has a flat tablet shaped body 2 formed by two moulded synthetic plastic upper and lower shells 4 and 6 secured together by welding, the shells retaining between them the remaining components of the tester, namely a circuit board 8 including a battery 12 and an array 10 of five light emitting diodes mounted on the board and having lenses visible through a slot in the upper shell, and contact strips which provide continuity with test contacts in apertures 18, 20, 22, 24, which are sized to accommodate cells of AAA, AA, C and D sizes respectively. Each aperture in the upper shell is slightly larger than the cell it is to receive, and each aperture in the lower shell tapers so as to be slightly narrower than the diameter of the cell, so that when a cell is inserted into the appropriate aperture from the top of the tester, it cannot pass through the bottom but instead is located with its terminals in contact with test contacts 26 and 28 at opposite ends of the apertures. Two further apertures 30, 32 in the upper shell provide access to test contacts 26 and 28 for the terminals of a standard 9 volt battery. The test contacts 26 and 28 are integral with the contact strips 34, 36, 38 and 40 which provide a common negative connection to the test contacts 26, and independent positive connections to the test contacts 28 for C and D, AA and AAA, and 9 volt batteries. The contact strips are soldered to the circuit board. A switch button 42 is captive between the shell and recessed into the side of the tablet to prevent inadvertent depression. Depression of the button 42 activates switch contact 44 as described further below with reference to FIG. 3 which shows the circuit embodied by the circuit board 8. This circuit comprises four precision voltage comparators C1, C2, C3, C4 conveniently implemented by an LM 339 quadruple voltage comparator integrated circuit, available at low cost from National Semiconductor and other manufacturers, light emitting diodes LED1, LED2, LED3, LED4 and LED5 forming the array 10, a conventional low cost silicon diode D1, and various resistors R1–R16 in addition to the battery 12, typically a 3 volt lithium cell.

The contact 44 completes a circuit from the negative terminal of the battery 12 to the remainder of the circuit and to the test contacts 26, thus powering the comparators C1–C4 and a circuit including a resistor R5 and light emitting diode LED5, which emits red light. Passage of current through LED5 not only illuminates the LED thus verifying that the device is powered, but establishes a reasonably constant forward voltage drop across LED5, typical of the characteristics of such a device. This voltage drop is applied in turn to a circuit comprising a further resistor R6, the diode D1, and a resistor ladder formed by resistors R11, R12, R13 and R14. The fairly constant voltage across LED5 means that the current through D1 remains comparably constant, allowing the forward voltage drop across diode D1 to act as a fairly precise voltage reference. This in turn establishes constant potentials at the nodes of the resistor chain which are connected to reference inputs of the comparators C1, C2, C3 and C4.

According to which type of battery is being tested, the potential of the battery appears across a potential divider formed by resistor R10 and one of resistors R7, R8 and R9. Additional resistors R15 and R16 apply a suitable additional loading to C or D, or AA or AAA cells. The relative values of resistors R10 and R7, R8 and R9 are calculated so that a battery in new condition will produce about 0.6 volts across R10, just higher than the reference voltage developed across D1.

The values of R11, R12, R13 and R14 are selected so that, typically, about 0.4 volts is developed across R14, and increasing levels intermediate between 0.4 and 0.6 volts at the upper ends of resistors R13 and R14. This means that a 1.5 volt (nominal) cell which develops at least 1.5 volts will result in the comparators producing high outputs which will pass currents through LED1, LED2, LED3 and their associated resistors R1, R2, R3 and R4. As the cell voltage drops, first LED1, then LED2, then LED3 and the LED4 will be extinguished, leaving only LED5, whose red light provides a bad battery indication. Typically LED4 will be a yellow LED, and LED1 and LED2 will be green LED's, and LED3 may be green or yellow. A battery for which the LED array shows only red is bad; yellow and red is marginal, and green, yellow and red is good. Accordingly by arranging the light emitting diodes in a row, a bar-graph type display can be produced without the expense of a conventional bar-graph display and driver.

The flat configuration of the unit means that it takes very little space, yet it provides nearly all of the functionality of conventional full sized battery testers.

Figure 4:
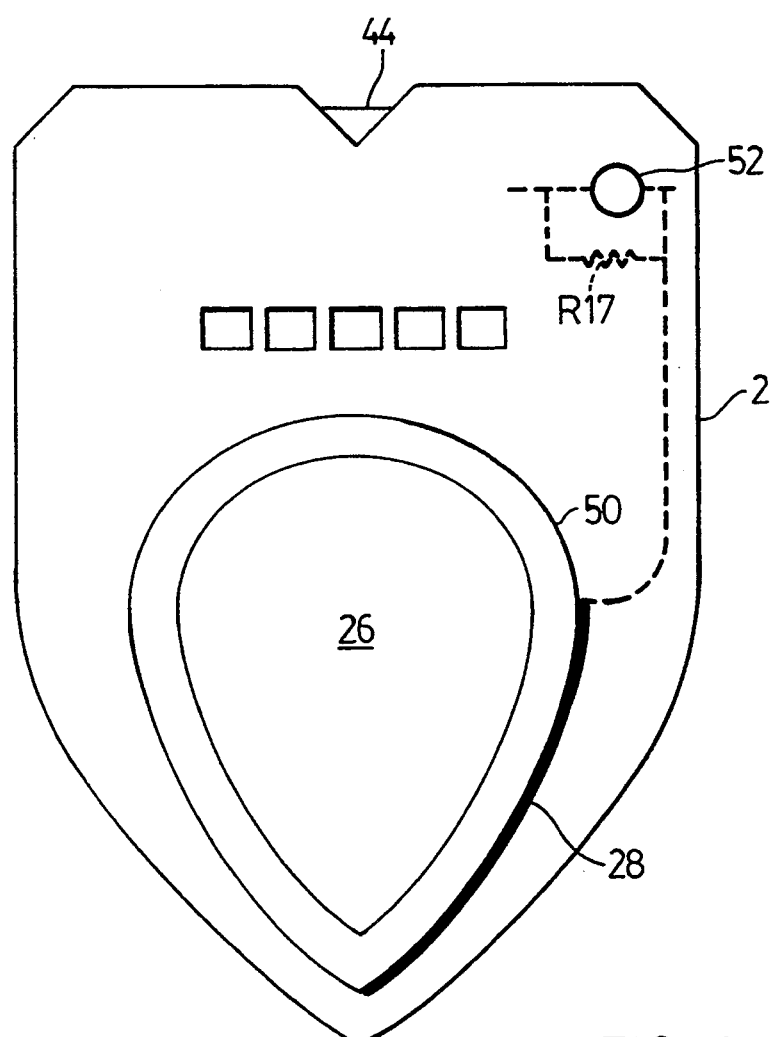
FIG. 4 is a plan view of a second embodiment of the tester.

In the embodiment of FIG. 4, the apertures 18, 20, 22 and 24 of FIG. 1 are replaced by a single ovoid aperture 50 which extends only part way through the body 2. The test contacts 26 and 28 are located respectively at the bottom of the aperture and at one or both sides of the aperture so that a button cell placed with its center terminal face down on the contact 26 and moved downwards into the taper of the aperture so that its periphery engages the contact 28 will be connected to the tester. In other respects the tester works similarly to that shown in FIG. 4 except that there is no multiplicity of test contacts with associated additional resistors. In order to permit testing of both 1.5 volt and 3 volt cells, an additional switch 52 may be provided which may be opened to switch in a further resistor R17 in series with the contact 28 when 3 volt lithium cells are to be tested.

I claim:

1. A battery tester comprising a tablet shaped body having a thickness which is very small compares with its length and width, at least one recess in the body shaped to receive batteries to be tested an having a taper within the thickness of the body configured to guide terminals of said batteries into contact with test contacts within the thickness of the body, and a battery testing circuit within the thickness of the body and connected to said test contacts, the battery testing circuit including comparator carrying out comparisons of a voltage appearing across said contacts with plural reference voltages, and an array of light emitting diodes driven by said comparators to display results of said comparisons, wherein the body defines one recess in one face of the body, the recess having a bottom wall parallel to said one face of the body and peripheral side walls, the taper being defined by converging opposite side walls of the recess, one test contact being located in at least one of said opposite side walls of the recess, and the other being located on a bottom wall of the recess, whereby a button cell to be tested may be placed with one terminal resting on the bottom wall of the recess to contact said other terminal and moved into the taper until another terminal formed by a peripheral side wall of the cell contacts said one test contact.

2. A battery tester comprising a tablet shaped body having a thickness which is very small compared with its length and width, at least one recess in the body shaped to receive batteries to be tested and having a taper within the thickness of the body configured to guide terminals of said batteries into contact with test contacts within the thickness of the body, and a battery testing circuit within the thickness of the body and connected to said test contacts, the battery testing circuit including comparators carrying out comparisons of a voltage appearing across said contacts with plural reference voltages, and an array of light emitting diodes driven by said comparators to display results of said comparisons, wherein the test circuit comprises a reference voltage generator, a divided chain of resistors across which the reference voltage generator generates a reference voltage, multiple comparators each connected to a different mode of the divider chain and to an intermediate point of a resistor chain connected between the test contacts, and light emitting diodes driven by outputs of said comparators, and wherein the reference voltage generator includes a first forward biased light emitting diode in series with a load resistor to provide, an initial visual indication from the device, and a further forward biased diode in series with a further resistor, the series combination of the further diode and further resistor being in parallel with the first light emitting diode, the voltage across said further diode providing the reference voltage.

3. A battery tester according to claim 2, wherein an increasing battery voltage turns on an increasing number of the comparators and the light emitting diodes driven by their outputs, so as successively to element the initial visual indication from the first light emitting diode, which signifies on its own a bad battery, successive additive visual indications from the light emitting diodes driven by the comparators providing in combination a visual rating of battery condition.

* * * * *